(12) United States Patent
Kim

(10) Patent No.: US 7,167,948 B2
(45) Date of Patent: Jan. 23, 2007

(54) SEMICONDUCTOR MEMORY DEVICE

(75) Inventor: In-Soo Kim, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 415 days.

(21) Appl. No.: 10/741,630

(22) Filed: Dec. 18, 2003

(65) Prior Publication Data

US 2004/0221099 A1    Nov. 4, 2004

(30) Foreign Application Priority Data

Apr. 30, 2003 (KR) .................. 10-2003-0027875

(51) Int. Cl.
*G06F 12/16* (2006.01)

(52) U.S. Cl. ..................................................... 711/106

(58) Field of Classification Search ................. 711/105, 711/106, 107; 365/222
See application file for complete search history.

(56) References Cited

U.S. PATENT DOCUMENTS 6,292,420 B1 *   9/2001   Kim et al. .................. 365/222
6,385,692 B2 *   5/2002   Banks et al. ................. 711/105

FOREIGN PATENT DOCUMENTS

KR    1998-040799    8/1999
KR    1020000008778    2/2000

* cited by examiner

*Primary Examiner*—Kevin L. Ellis
(74) *Attorney, Agent, or Firm*—Blakely Sokoloff Taylor & Zafman

(57) ABSTRACT

A control circuit for a row active time includes a row active signal generator for generating a row active signal in response to a row active control signal and an active command signal, wherein the row active signal has the row active time defined by the row active control; and a row active control signal generator for generating the row active control signal in response to the row active signal, wherein the row active control signal is delayed for a predetermined time at an auto refresh operation.

15 Claims, 4 Drawing Sheets

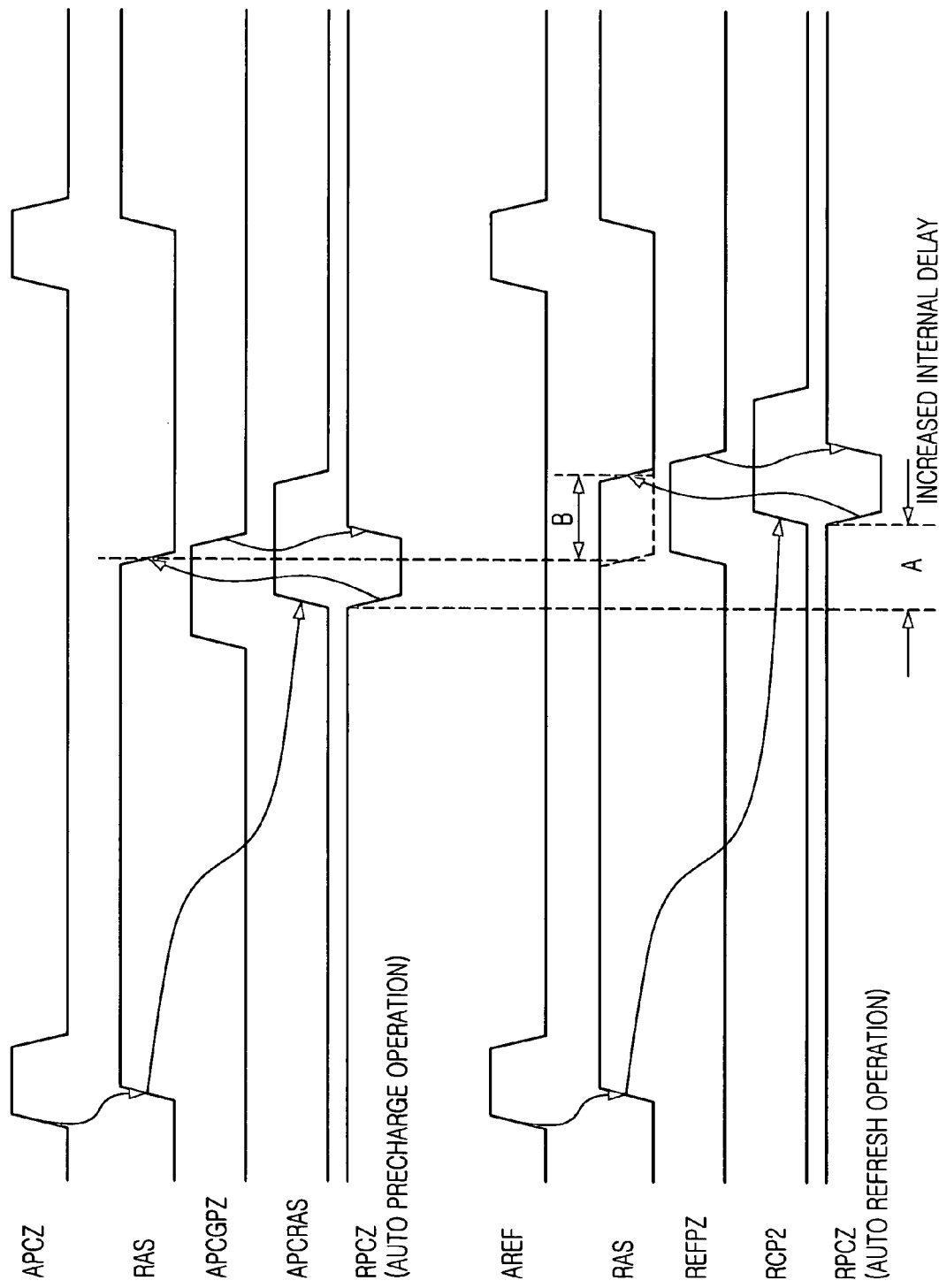

SEMICONDUCTOR MEMORY DEVICE

FIELD OF INVENTION

The present invention relates to a semiconductor memory device; and, more particularly, to a semiconductor memory device having an auto refresh mode and capability of controlling row active time.

DESCRIPTION OF PRIOR ART

Generally, a semiconductor memory device has two different types: one is a dynamic random access memory (DRAM) and the other is a static random access memory (SRAM).

Since a memory cell included in the SRAM is formed by four latched transistors, the SRAM can hold its data without refresh operation, as long as power is supplied to the SRAM.

In contrast, a memory cell included in the DRAM is formed by a transistor and a capacitor, and the capacitor has to be charged or discharged for the DRAM operation. However, charge quantity stored in the capacitor reduces as time passes. Therefore, the data stored in the DRAM must be refreshed periodically in order to hold its data contents. A retention time is a maximum time the memory cell can hold its data without the refresh operation.

There are two different refresh operations depending on the mode of the DRAM operation: one is an auto refresh operation; and the other is a self refresh operation. The self refresh operation is performed when the DRAM is not in a normal mode, i.e., the DRAM does not perform a data access. The auto refresh operation, however, is performed when the DRAM is in the normal mode.

In case of the DRAM's performing the auto refresh operation, if an auto precharge command or an auto refresh command is inputted to the DRAM, a row active operation and a precharge operation have to be performed within a predetermined time. Hereinafter, required time for the row active operation is referred as a row active time tRAS, and required time for the precharge operation is referred as a precharge time tRP.

While the DRAM operates, the row active time tRAS is a time period when the row active signal (RAS) is activated becoming a logic 'HIGH' level within a cycle of the RAS, and the precharge time tRP is a time period when the row active signal became inactivated becoming a logic 'LOW' level within the cycle of the tRAS.

Herein, a cycle time of the RAS is variable depending on the auto precharge operation and the auto refresh operation. That is, a cycle time of the RAS for the auto refresh operation is referred as an auto refresh row active signal cycle time tRFC and a cycle time of the RAS for the auto precharge operation is referred as an auto precharge row active signal cycle time tRC. The tRFC is set to be longer than the tRC to provide the sufficient row active time tRAS for the auto refresh operation.

FIG. 1 is a block diagram showing a control circuit for controlling the row active time tRAS included in a conventional semiconductor memory device.

As shown, the control circuit for controlling the row active time tRAS includes a RAS signal generator 10 and a precharge signal generator 12.

The RAS signal generator 10 generates a RAS responding to an auto refresh command signal AREF, an auto precharge command signal APCG and a row precharge signal RPCZ.

The precharge signal generator 12 serves to generate the row precharge signal RPCZ as a control signal in response to the RAS.

FIG. 2 is a timing diagram showing operation of the control circuit shown in FIG. 1.

As shown, if the auto refresh command signal AREF is activated, the RAS signal generator 10 activates the RAS.

Then, after a predetermined time passed, the precharge signal generator 12 activates the row precharge signal RPCZ, wherein the activated row precharge signal RPCZ is in a logic 'LOW' level. The activated row precharge signal RPCZ is feed-backed to the RAS signal generator 10 and inactivates the RAS.

If the auto precharge command signal APCG is activated, the control circuit performs the same operation for each of the auto refresh command signal AREF and the auto precharge signal APCG.

However, the auto refresh operation is performed for all the banks included in the conventional semiconductor memory device, to thereby need more margins of the row active time tRAS to complete the auto refresh operation than that for the auto precharge operation.

Therefore, since the row active time tRAS for the auto refresh operation should be longer than that for the auto precharge operation, the auto refresh row active signal cycle time tRFC can be set to be longer than the auto precharge row active signal cycle time tRC in the conventional semiconductor memory device. For example, in a DDR333 semiconductor memory device (a kind of a double data rate semiconductor memory device), the tRFC is set to 70 ns and the tRC is set to 60 ns.

However, as shown in FIG. 2, the conventional semiconductor memory device employs only one circuit, e.g., the precharge signal generator for generating the control signal RPCZ. That is, the same control signal RPCZ for activating or inactivating the RAS is used in the auto refresh operation and the auto precharge operation. As a result, although the auto refresh row active signal cycle time tRFC is different from the auto precharge row active signal cycle time tRC, the row active time tRAS in the auto refresh operation is identical to that in the auto precharge operation.

Therefore, since the conventional semiconductor memory device has short of margin of the row active time tRAS in the auto refresh operation, there is a problem the performance of DRAM may be degraded.

SUMMARY OF INVENTION

It is, therefore, an object of the present invention to provide a semiconductor memory device for controlling a row active time adaptive to the operation mode to thereby have a sufficient margin of the row active time.

In accordance with an aspect of the present invention, there is provided a semiconductor memory device including a unit for generating a row active signal responding to a feed-backed row precharge signal as well as an auto refresh command signal; and a unit for generating the row precharge signal responding to the row active signal; wherein the row precharge signal is delayed for a predetermined time at an auto refresh operation.

BRIEF DESCRIPTION OF THE DRAWINGS

The above and other objects and features of the present invention will become apparent from the following description of preferred embodiments taken in conjunction with the accompanying drawings, in which:

FIG. 5 is a timing diagram showing operation of the control circuit shown in FIGS. 3 and 4.

DETAILED DESCRIPTION OF INVENTION

Hereinafter, a control circuit for controlling a row active time, for use in a semiconductor memory device, in accordance with the present invention will be described in detail referring to the accompanying drawings.

Figure 1:
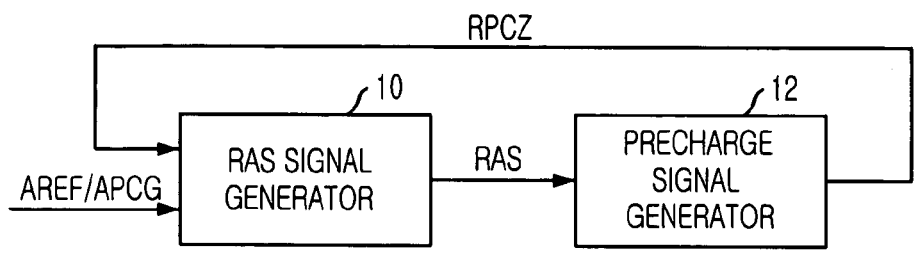
FIG. 1 is a block diagram showing a control circuit included in a conventional semiconductor memory device for controlling a row active time.
Figure 2:
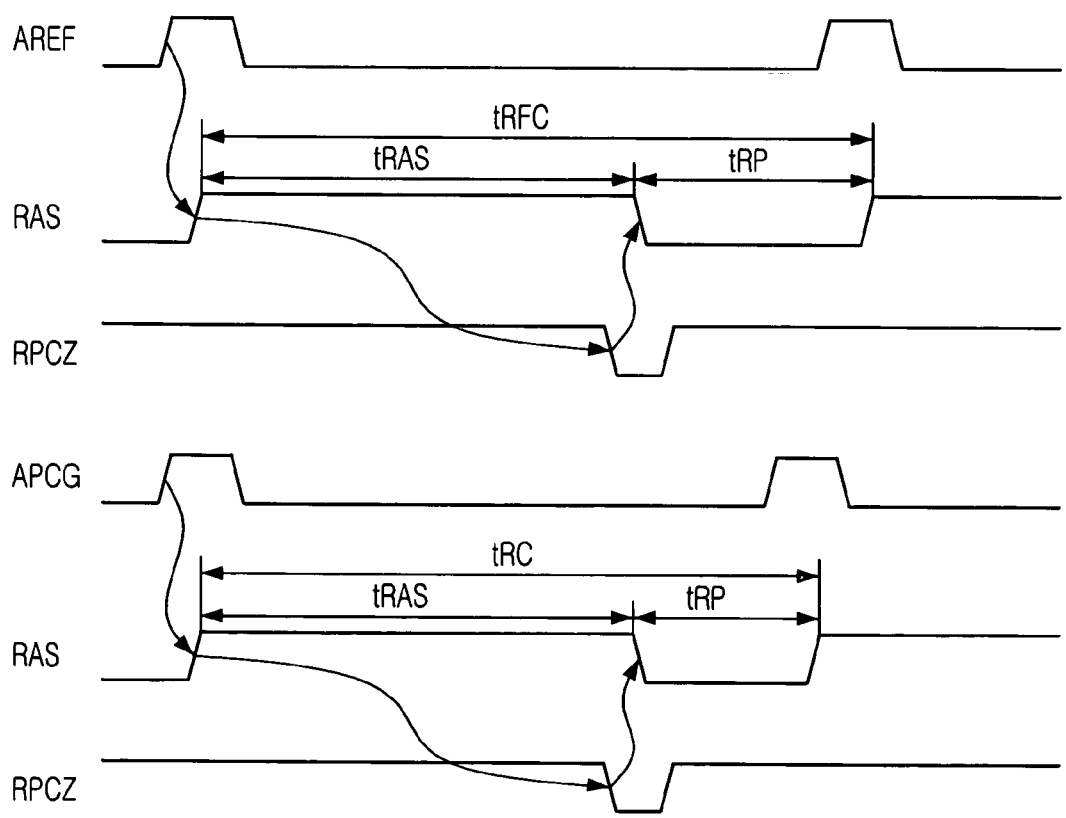
FIG. 2 is a timing diagram showing operation of the control circuit shown in FIG. 1.
Figure 3:
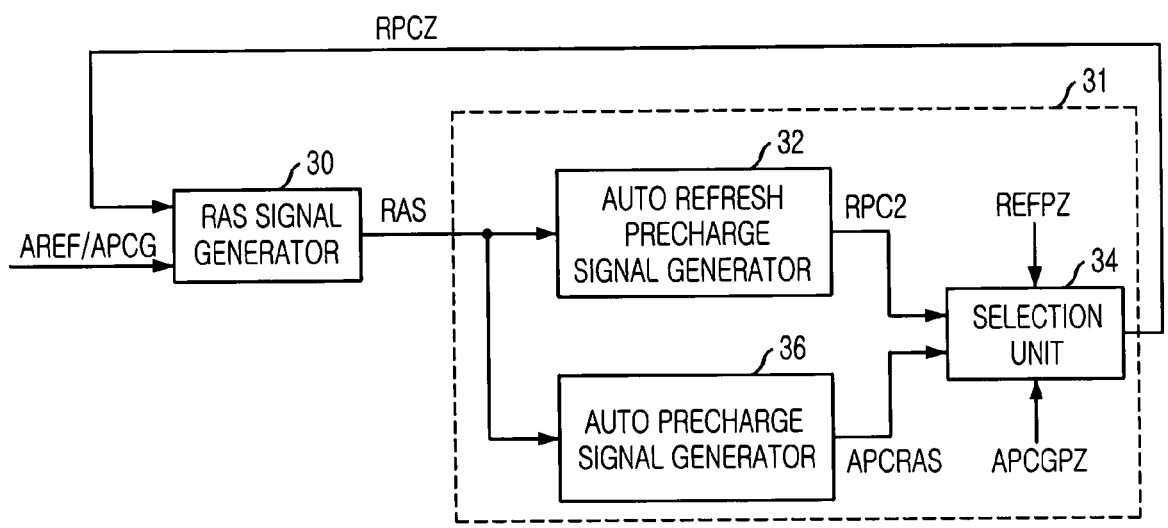
FIG. 3 is a block diagram showing a control circuit in accordance with a preferred embodiment of the present invention.

FIG. 3 is a block diagram showing the control circuit for controlling a row active time tRAS in accordance with a preferred embodiment of the present invention.

As shown, the control circuit includes a RAS signal generator 30 and a precharge signal generator 31.

The RAS signal generator 30 generates a RAS in response to a feed-backed row precharge signal RPCZ, and an auto refresh command signal AREF or an auto precharge command signal APCG.

The precharge signal generator 31 includes an auto refresh precharge signal generator 32, an auto precharge signal generator 36 and a selection unit 34.

The auto refresh precharge signal generator 32 generates the auto refresh precharge signal REF_RPCZ in response to the RAS and a refresh pulse signal REFPZ. The auto precharge signal generator 36 generates an auto precharge signal PRE_RPCZ in response to the row active signal RAS and an auto precharge pulse signal APCGPZ. Herein, the refresh pulse signal REFPZ and the auto precharge pulse signal APCGPZ are generally used control signals for the auto refresh operation and the auto precharge operation.

That is, the control circuit in accordance with the present invention generates different precharge signals depending on the auto refresh command signal AREF and the auto precharge command signal APCG.

Figure 4:
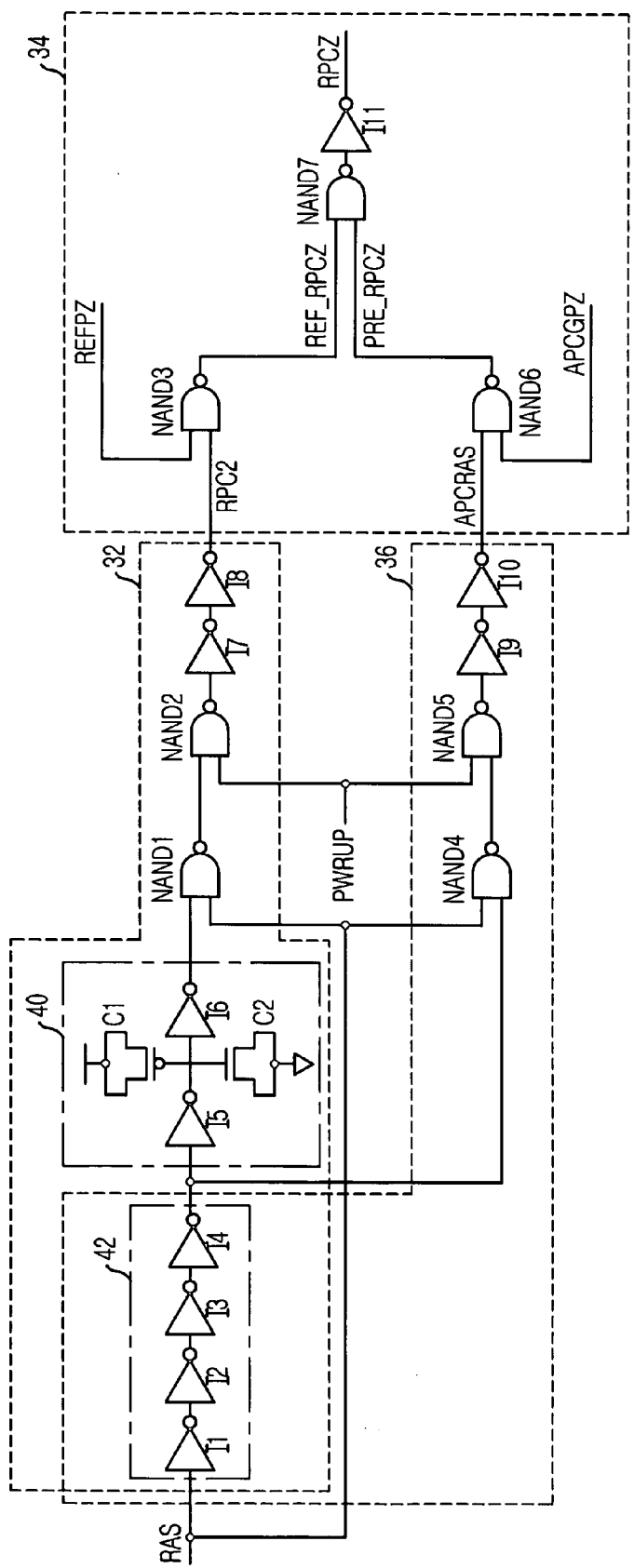
FIG. 4 is a circuit diagram showing an auto refresh precharge signal generator and an auto precharge signal generator shown in FIG. 3.

FIG. 4 is a circuit diagram showing the auto refresh precharge signal generator 32, the auto precharge signal generator 36 and the control unit 34 in accordance with the preferred embodiment of the present invention.

As shown, the auto precharge signal generator 36 includes a first delay unit 42, a fourth NAND gate NAND4, a fifth NAND gate NAND5, a ninth inverter I9 and tenth inverter I10.

The first delay unit 42 receives the RAS and delays the RAS; herein, the first delay unit 42 includes even number of inverters. The fourth NAND gate NAND4 receives the RAS and an outputted signal from the first delay unit 42, and performs logic NAND operation on the two received signals.

The fifth NAND gate NAND5 receives a power up signal PWRUP and an outputted signal from the fourth NAND gate NAND4 and performs logic NAND operation on the two received signals.

The ninth inverter I9 and the tenth inverter I10 are for delaying an outputted signal from the fifth NAND gate NAND5.

The auto refresh precharge signal generator 32 includes the first delay unit 42, an additional second delay unit 40, a first NAND gate NAND1, a second NAND gate NAND2, a seventh inverter I7 and an eighth inverter I8.

The first delay unit 42 receives the RAS and delays the RAS. Likewise, the additional second delay unit 40 delays an outputted signal from the first delay unit 42 for a predetermined time. This predetermined time is determined by the number of inverters included in the additional second delay unit 40.

The first NAND gate NAND1 receives an outputted signal from the additional second delay unit 40 and the RAS, and outputs the resultant signal of logic NAND operation.

The second NAND gate NAND2 receives an outputted signal from the first NAND gate NAND1 and the power up signal PWRUP.

The seventh inverter I7 and the eighth inverter I8 are for delaying an outputted signal from the second NAND gate NAND2.

The selection unit 34 includes a third NAND gate NAND3, a sixth NAND gate NAND6, a seventh NAND gate NAND7 and an eleventh inverter I11.

The third NAND gate NAND3 receives a first outputted signal RPC2 from the auto refresh precharge signal generator 32 and the refresh pulse signal REFPZ, and outputs the auto refresh precharge signal REF_RPCZ after performing logic NAND operation on the RPC2 and the REFPZ.

The sixth NAND gate NAND6 receives a second outputted signal APCRAS from the auto precharge signal generator 36 and the auto precharge pulse signal APCGPZ, and outputs the auto precharge signal PRE_RPCZ after performing logic NAND operation on the APCRAS and the APCGPZ.

The seventh NAND gate receives the auto refresh precharge signal REF_RPCZ and the auto precharge signal PRE_RPCZ; and performs logic NAND operation on the received two signals the REF_RPCZ and the PRE_RPCZ.

The eleventh inverter I11 receives an outputted signal from the seventh NAND gate NAND7 and outputs a row precharge signal RPCZ.

The third NAND gate NAND3, the sixth NAND gate NAND 6, the seventh NAND gate NAND7 and the eleventh inverter I11 are for selecting and outputting one of the precharge signals the REF_RPCZ and the PRE_RPCZ depending on the refresh pulse signal REFPZ and the auto precharge pulse signal. The outputted signal from the inverter I11 is coupled back to the RAS signal generator 20 as the row precharge signal RPCZ.

Meanwhile, in case of the embodiment shown in FIG. 4, the auto refresh precharge signal generator 32 and the auto precharge signal generator 36 share the first delay unit 42. However, the embodiment can be modified so that each of those generators 32 and 36 independently includes the same delay unit as the first delay unit 42. The additional second delay unit 40 can be coupled next to the first NAND gate NAND1.

FIG. 5 is a timing diagram showing an operation of the present invention.

Referring to FIGS. 4 and 5, the operation of the present invention described as below.

At initial state, the RAS is in a logic 'LOW' level. The RPC2, APCRAS, the REFPZ and the APCGPZ are also in logic 'LOW', thereby the RPCZ is in a logic 'HIGH' level.

Thereafter, if the auto refresh command signal AREF is activated to a logic 'HIGH' level, the RAS becomes activated to a logic 'HIGH' level, thereby the first outputted signal RPC2 and the second outputted signal APCRAS become a logic 'HIGH' level. The refresh pulse signal REFPZ which indicates that the auto refresh command signal AREF is activated becomes a logic 'HIGH' level; the auto precharge pulse signal APCGPZ, however, holds a logic 'LOW' level. Then, the auto refresh precharge signal REF_RPCZ is changed from a logic 'HIGH' level to a logic 'LOW' level because of the third NAND gate NAND3, but the auto precharge signal PRE_RPCZ holds a logic 'HIGH' level. Therefore, the row precharge signal RPCZ becomes a logic 'LOW' level disabling the RAS; at this time, the row precharge signal RPCZ is the same signal as the auto refresh precharge signal REF_RPCZ outputted from the third NAND gate NAND3.

On the other hand, if the auto precharge command signal APCG is activated, the operation of the present invention is same as above except that the refresh pulse signal REFPZ holds a logic 'LOW' level and the auto precharge pulse signal APCGPZ becomes a logic 'HIGH' level. Therefore, the row precharge signal RPCZ becomes in a logic 'LOW' level in order to disable the RAS; at this time, the row precharge signal RPCZ is the same signal as the auto precharge signal PRE_RPCZ.

Herein, the time period while the row precharge signal RPCZ holds a logic 'LOW' level is determined by the refresh pulse signal REFPZ and the auto precharge pulse signal APCGPZ.

As shown in FIG. 5, the activating timing of the row precharge signal RPCZ at the auto refresh operation is delayed by 'A' compared to that of the row precharge signal RPCZ at the auto precharge operation.

Therefore, the inactivated timing of the RAS is delayed by 'B' in the auto refresh operation compared to the auto precharge operation.

Subsequently, a sufficient margin of the row active time tRAS is provided for the auto refresh operation, thereby a performance of the semiconductor memory device can be improved.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
   a row active signal generator for generating a row active signal in response to a row active control signal and an active command signal, wherein the row active signal has a row active time defined by the row active control signal;
   a row active control signal generator for selectively generating a precharge signal and a refresh precharge signal in response to the row active signal according to an operation mode and outputting the generated signal as the row active control signal, wherein the refresh precharge signal is delayed for a predetermined time.

2. The semiconductor memory device as recited in claim 1, wherein the row active control signal generator includes:
   an auto precharge signal generator for generating the precharge signal in response to the row active signal;
   an auto refresh precharge signal generator for generating the refresh precharge signal in response to the row active signal; and
   a selection unit for selecting one of the precharge signal and the refresh precharge signal according to the operation mode to output the selected signal as the row active control signals.

3. The semiconductor memory device as recited in claim 2, wherein the selection unit provides the precharge signal as the row active control signal in response to an auto precharge pulse signal; and provides the refresh precharge signal as the row active control signal in response to an auto refresh pulse signal.

4. The semiconductor memory device as recited in claim 2, wherein the auto refresh precharge signal generator has a delay unit for delaying the row active signal for the predetermined time.

5. The semiconductor memory device as recited in claim 2, wherein the auto precharge signal generator includes a first signal output unit, having a first delay and a logic circuit, to output the precharge signal.

6. The semiconductor memory device as recited in claim 5, wherein the auto precharge signal generator includes a first initializing unit for initializing an outputted signal from the first signal output unit in response to a power up signal.

7. The semiconductor memory device as recited in claim 5, wherein the auto refresh precharge signal generator includes a second signal output unit, having the first delay and the logic circuit, for receiving the row active signal to output the refresh precharge signal, wherein the second signal output unit has an additional second delaying unit to delay the row active signal for the predetermined time.

8. The semiconductor memory device as recited in claim 7, wherein the auto refresh precharge signal generator includes a second initializing unit for initializing an outputted signal from the second signal output unit in response to a power up signal.

9. A row active signal generator for use in a semiconductor memory device, comprising:
   an auto precharge signal generator for generating a precharge signal in response to a row active signal;
   an auto refresh precharge signal generator for generating a refresh precharge signal in response to the row active signal; and
   a selection unit for selecting one of the precharge signal and the refresh precharge signal according to an operation mode to output the selected signal as a row active control signal,
   wherein the refresh precharge signal is delayed for a predetermined time.

10. The row active signal generator as recited in claim 9, wherein the selection unit provides the precharge signal as the row active control signal in response to an auto precharge pulse signal; and provides the refresh precharge signal as the row active control signal in response to an auto refresh pulse signal.

11. The row active signal generator as recited in claim 9, wherein the auto refresh precharge signal generator has a delay unit for delaying the row active signal for the predetermined time.

12. The row active signal generator as recited in claim 9, wherein the auto precharge signal generator includes a first signal output unit, having a first delay and a logic circuit, to output the precharge signal.

13. The row active signal generator as recited in claim 12, wherein the auto precharge signal generator includes a first initializing unit for initializing an outputted signal from the first signal output unit in response to a power up signal.

14. The row active signal generator as recited in claim 12, wherein the auto refresh precharge signal generator includes a second signal output unit, having the first delay and the logic circuit, for receiving the row active signal to output the refresh precharge signal, the second signal output unit has an additional second delaying unit to delay the row active signal for the predetermined time.

15. The row active signal generator as recited in claim 14, wherein the auto refresh precharge signal generator includes a second initializing unit for initializing an outputted signal from the second signal output unit in response to a power up signal.

* * * * *